United States Patent
Pal et al.

(10) Patent No.: US 7,838,308 B2
(45) Date of Patent: Nov. 23, 2010

(54) METHOD OF CONTROLLING EMBEDDED MATERIAL/GATE PROXIMITY

(75) Inventors: Rohit Pal, Fishkill, NY (US); David E. Brown, Pleasant Valley, NY (US); Alok Vaid, Beacon, NY (US); Kevin Lensing, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 162 days.

(21) Appl. No.: 12/119,196

(22) Filed: May 12, 2008

(65) Prior Publication Data

US 2009/0280579 A1 Nov. 12, 2009

(51) Int. Cl.
*H01L 21/00* (2006.01)

(52) U.S. Cl. .................. 438/5; 438/4; 438/800

(58) Field of Classification Search .......... 438/5, 438/14–18, 800
See application file for complete search history.

(56) References Cited

U.S. PATENT DOCUMENTS

| | | | | |
|---|---|---|---|---|
| 6,638,776 | B2* | 10/2003 | May ................ | 438/5 |
| 7,101,799 | B2* | 9/2006 | Paik ................ | 438/692 |
| 2002/0132377 | A1* | 9/2002 | Conchieri et al. ....... | 438/5 |
| 2003/0098479 | A1* | 5/2003 | Murthy et al. .......... | 257/288 |
| 2004/0040001 | A1* | 2/2004 | Miller et al. .......... | 716/4 |
| 2005/0093084 | A1* | 5/2005 | Wang et al. .......... | 257/410 |
| 2005/0130432 | A1* | 6/2005 | Machala .............. | 438/694 |
| 2007/0048918 | A1* | 3/2007 | Shibata et al. ........ | 438/197 |
| 2007/0269952 | A1* | 11/2007 | Chong et al. ......... | 438/301 |
| 2007/0275510 | A1* | 11/2007 | Chen et al. .......... | 438/142 |
| 2009/0001484 | A1* | 1/2009 | Feudel et al. ........ | 257/408 |

* cited by examiner

*Primary Examiner*—Ha Tran T Nguyen
*Assistant Examiner*—Karen M Kusumakar
(74) *Attorney, Agent, or Firm*—Ditthavong, Mori & Steiner, P.C.

(57) ABSTRACT

A method that includes forming a gate of a semiconductor device on a substrate and forming a recess for an embedded silicon-straining material in source and drain regions for the gate. In this method, a proximity value, which is defined as a distance between the gate and a closest edge of the recess, is controlled by controlling formation of an oxide layer provided beneath the gate. The method can also include feedforward control of process steps in the formation of the recess based upon values measured during the formation of the recess. The method can also apply feedback control to adjust a subsequent recess formation process performed on a subsequent semiconductor device based on the comparison between a measured proximity value and a target proximity value to decrease a difference between a proximity value of the subsequent semiconductor device and the target proximity value.

22 Claims, 9 Drawing Sheets

METHOD OF CONTROLLING EMBEDDED MATERIAL/GATE PROXIMITY

BACKGROUND OF THE INVENTION

1. Field of the Invention

The present invention relates to embedded silicon-straining material structures used to enhance semiconductor device performance.

2. Discussion of the Background

An important aim of ongoing research in the semiconductor industry is increasing semiconductor performance while decreasing power consumption in semiconductor devices. Planar transistors, such as metal oxide semiconductor field-effect transistors (MOSFETs), are particularly well-suited for use in the high-density integrated circuits. As the size of MOSFETs and other devices decrease, the dimensions of source/drain regions, channel regions, and gate electrodes of the devices, also decrease. However, the benefits of simply making devices smaller (conventional scaling) are diminishing, and thus new material based innovations like embedded silicon-straining materials, such as embedded silicon germanium (eSiGe) and embedded silicon carbide (eSiC), that can boost performance have gained increased interest.

As micro-miniaturization of devices and circuits proceeds, there is an attendant need to increase the drive current of transistors by enhancing carrier mobility. Substrates based on "strained silicon" have attracted much interest as a semiconductor material that provides increased speeds of electron and hole flow therethrough, thereby permitting fabrication of semiconductor devices with higher operating speeds, enhanced performance characteristics, and lower power consumption. In such a device, a very thin, tensely strained, crystalline silicon (Si) layer is grown on a relaxed, graded composition of SiGe buffer layer several microns thick, which SiGe buffer layer in turn is formed on a suitable crystalline substrate, e.g., a silicon wafer or a silicon-on-insulator (SOI) wafer. Strained silicon technology is based upon the tendency of silicon atoms, when deposited on a SiGe buffer layer, to align with the greater lattice constant (spacing) of SiGe atoms (relative to pure silicon).

As a consequence of the silicon atoms being deposited on a substrate (SiGe) comprised of atoms which are spaced further apart, they "stretch" to align with the underlying SiGe atoms, thereby "stretching" or tensely straining the deposited silicon layer. The electrons in such tensile strained silicon layers have greater mobility than in conventional, relaxed silicon layers with smaller inter-atom spacings, i.e., there is less resistance to electron and/or hole flow.

One method for applying compressive strain to the channels of p-channel MOSFET devices is known as an embedded SiGe (or eSiGe) technique. Such a technique applies uniaxial compressive strain to the channels of the PFET devices. In this technique, recesses are etched in the source and drains of the MOSFET devices, and are filled with selective epitaxial SiGe. Since the lattice constant of SiGe is different from that of silicon, mechanical strain is induced in the crystal layers to accommodate the lattice mismatch. The embedded geometry plus the compressive source/drain caused by the mismatch produces a relatively large uniaxial compressive channel strain. This produces a large enhancement in hole mobility.

Various parameters of an eSiGe structure can have an effect on the semiconductor device yield and performance. Thus, there is a need to provide accurate control of such parameters.

SUMMARY OF THE INVENTION

The present invention advantageously provides embodiments of a method including forming a gate of a semiconductor device on a substrate, and forming a recess for an embedded silicon-straining material in source and drain regions for the gate. In such method, a proximity value, which is defined as a distance between the gate and a closest edge of the recess, is controlled by controlling formation of an oxide layer provided beneath the gate.

The present invention also advantageously provides embodiments of a method including forming a gate of a semiconductor device on a substrate, forming a recess for an embedded silicon-straining material in source and drain regions for the gate, and measuring a proximity value of the recess, wherein the proximity value is defined as a distance between the gate and a closest edge of the recess. The method also includes comparing the measured proximity value to a target proximity value, and applying feedback control to adjust a subsequent recess formation process performed on a subsequent semiconductor device based on the comparison between the measured proximity value and the target proximity value to decrease a difference between a proximity value of the subsequent semiconductor device and the target proximity value.

The present invention further advantageously provides embodiments of a method including forming a gate of a semiconductor device on a substrate, and forming a recess for an embedded silicon-straining material in source and drain regions for the gate, where a proximity value, which is defined as a distance between the gate and a closest edge of the recess, is controlled by feedforward control of process steps in the formation of the recess based upon values measured during the formation of the recess.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1A:
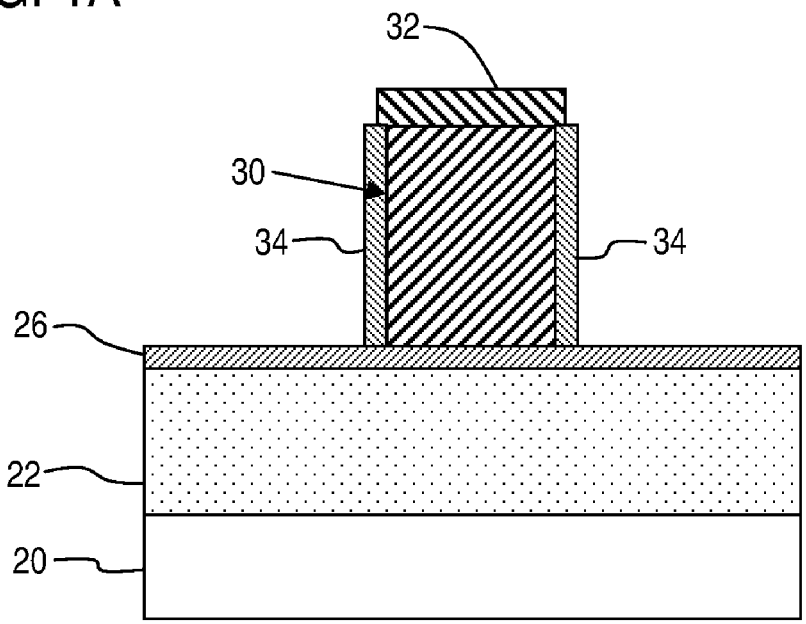
FIGS. 1A-1D are cross-sectional views depicting a semiconductor device during various phases of manufacture of the device including gate formation and spacer formation.

Embodiments of the present invention will be described hereinafter with reference to the accompanying drawings. In the following description, the constituent elements having substantially the same function and arrangement are denoted by the same reference numerals, and repetitive descriptions will be made only when necessary.

Various parameters of embedded silicon-straining material (also referred to herein simply as "embedded material") structures, such as embedded silicon germanium (eSiGe) structures and embedded silicon carbide (eSiC) structures, that boost performance can have an effect on the semiconductor device yield and the actual performance of the semiconductor device. However, due to increased miniturization of semiconductor devices incorporating such structures, it is becoming increasingly difficult to measure and control various parameters of such structures. It has been determined that proximity of the eSiGe trench to the corresponding gate of the semiconductor device is a parameter that has significant influence on device performance. The inventors have determined that monitoring and controlling the embedded material/gate proximity by utilizing an advanced process control (APC) approach is highly advantageous for future technology nodes (e.g., 45 nm and beyond) due to yield concerns and device sensitivities.

Set forth herein are embodiments of the present invention that advantageously provide an APC solution that allows for inline monitoring/detection of embedded material/gate proximity, and/or active process control of such proximity using feedback control, feedforward control, or both.

Figure 4:
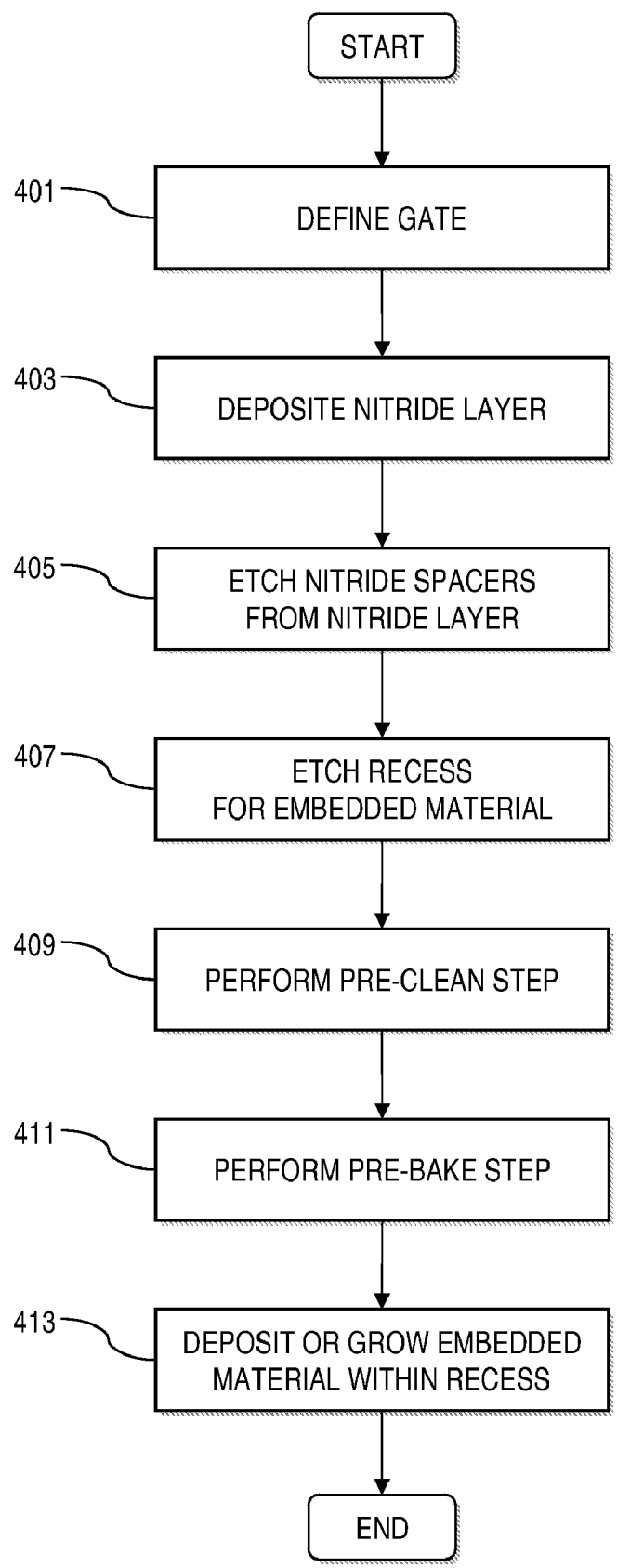
FIG. 4 is a flow-diagram setting forth various processing steps of the semiconductor device, and to which the depictions in FIGS. 1A-1D, 2A-2C, and 3A-3D relate.

FIGS. 1A-1D are cross-sectional views depicting a semiconductor device during various phases of manufacture of the device, such as a positive field-effect transistor (PFET). FIG. 4 is a flow-diagram that sets forth various processing steps to which embodiments of the present invention relate. Steps 401, 403, 405, and 407 in FIG. 4 relate to the depictions in FIGS. 1A-1D, respectively, and these steps will be discussed below. These steps are performed in preparation for growth or deposition of an embedded material in a recess adjacent to a gate of the PFET that can greatly improve performance and process yield. The dimensions and location of a final recess in which the embedded material is formed are features that affect the overall effectiveness of the embedded material in such a device.

In step 401, a gate 30 of the PFET is defined, and the resulting structure is depicted in FIG. 1A. The PFET is located on a silicon-on-insulator (SOI) arrangement, for example, but can be on a bulk silicon layer in other embodiments. As shown in FIG. 1A, a silicon substrate 20 having an oxide layer 22. The oxide layer 22 is formed, for example, of a buried oxide layer and a shallow trench isolation (STI) oxide. An active region is located in the oxide layer 22 including source and drain regions, and, at a later stage of manufacturing, a source and a drain will be formed therein in a known manner. An oxide layer 26 is deposited or grown over the active region to protect the gate. The gate 30 is formed of polysilicon on the oxide layer 26, and the gate 30 can have liner oxide/offset spacers 34 on lateral sides thereof. A top of the gate 30 is provided with a cap 32, which can be made of nitride or silicon nitride, for example.

Figure 1B:
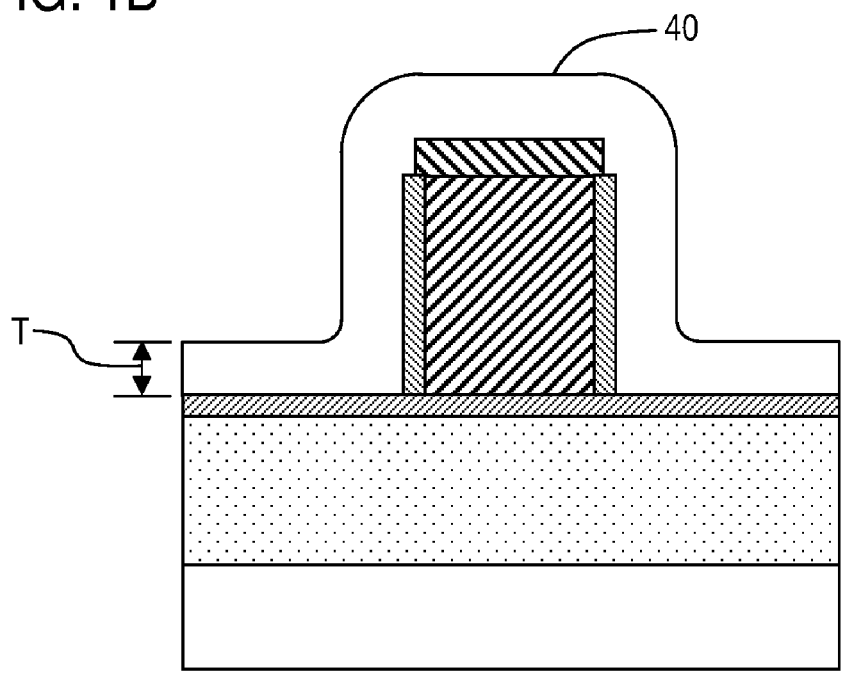

In step 403, a nitride layer is deposited over the structure depicted in FIG. 1A, which results in the structure depicted in FIG. 1B. The nitride layer 40 is formed using a nitride deposition recipe that can be varied to provide a target thickness of the layer deposited using the recipe. However, an actual thickness T of the nitride layer 40 deposited may in some instances vary from the intended target thickness.

Figure 1C:
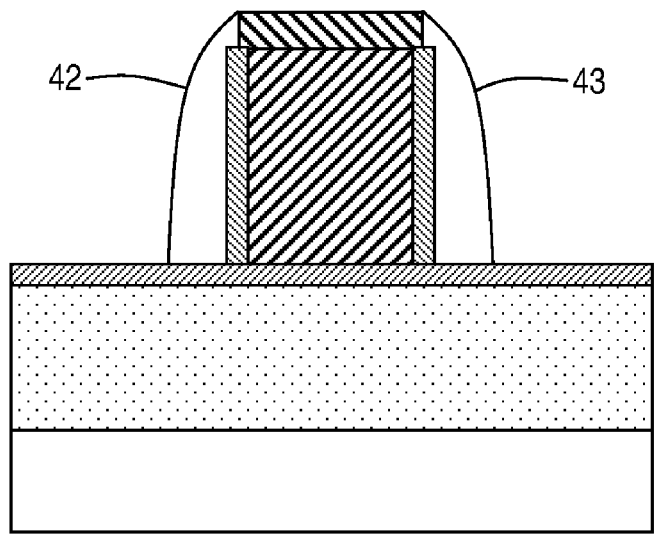

In step 405, the nitride layer is etched to form nitride spacers 42 and 43 on the lateral sides of the gate, which results in the structure depicted in FIG. 1C. The nitride spacers 42 and 43 are formed using a spacer etch recipe that can be varied to provide nitride spacers having a desired resulting size and width.

Figure 1D:
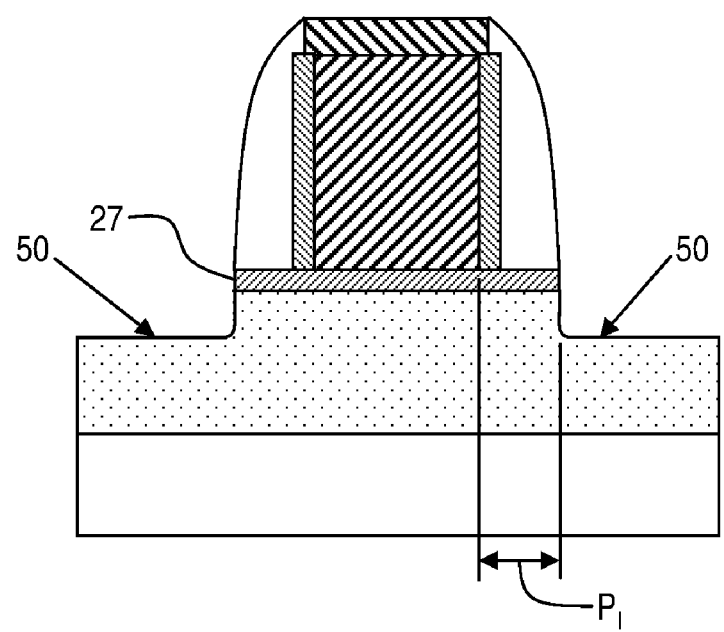

In step 407, a recess (or cavity) is etched in which the embedded material can be formed. FIG. 1D depicts the recess 50, which extends downward within the SOI arrangement and the source/drain region that will later become the source and the drain of the gate. The recess 50 is formed using a recess etch recipe that can be varied to provide a recess having a desired resulting size. Note also that the oxide layer 26 (shown in FIGS. 1A-1C) has also been etched to form oxide layer 27 (which can be performed in an etching process separate from the etching of the recess 50), which conforms generally to the width of outermost edges of the nitride spaces 42 and 43.

At this stage, innermost edges (i.e., edges closest to the gate 30) of the recess 50 generally conform to the width of the outermost edges of the nitride spaces 42 and 43. Accordingly, the innermost edges of the recess 50, at this stage, have an initial proximity ($P_I$) to the gate 30 as shown in FIG. 1D, which is the distance (which is generally, but not necessarily, horizontal in orientation) from the innermost edge of the recess 50 to the closest edge of the gate 30. Thus, if the embedded material were formed in the recess 50, then the proximity of the embedded material to the gate would be the initial proximity ($P_I$) value. However, prior to the formation of the embedded material in the recess, a pre-clean step 409 and a pre-bake step 411 are performed, which can have an effect on proximity, as will be discussed in greater detail below with respect to FIGS. 2A-2C and FIGS. 3A-3C.

Figure 2A:
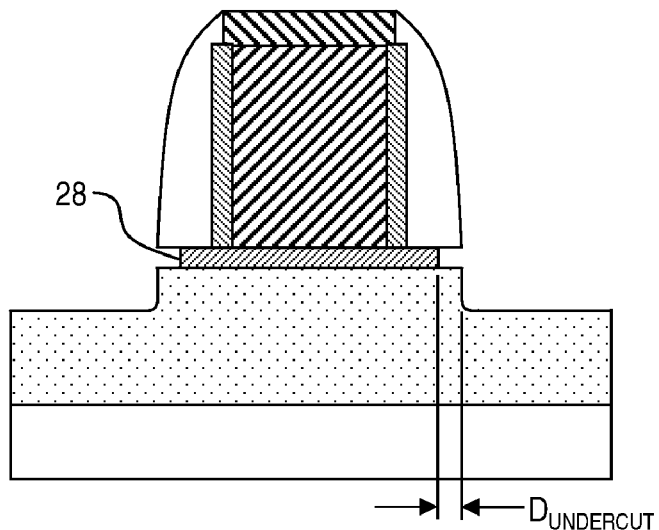
FIGS. 2A-2C are cross-sectional views depicting the semiconductor device of FIGS. 1A-1D during various phases in preparation for and during formation of an embedded material according to a first process mechanism.
Figure 2B:
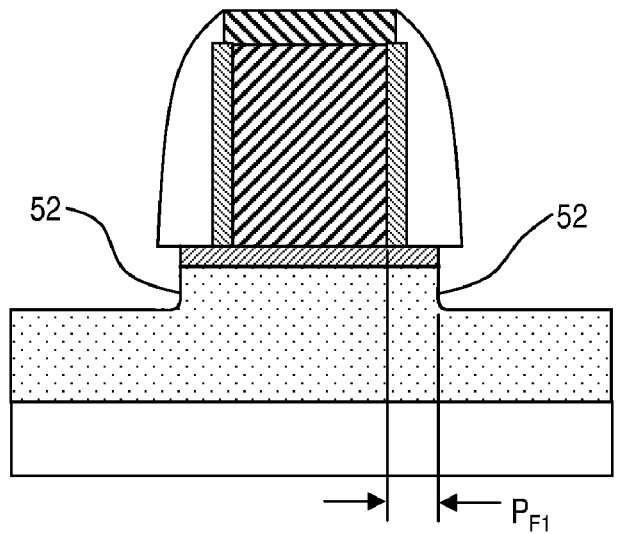
Figure 2C:
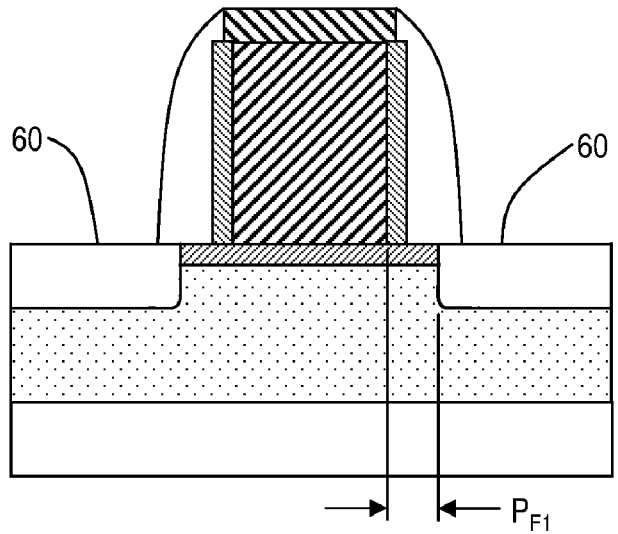
Figure 3A:
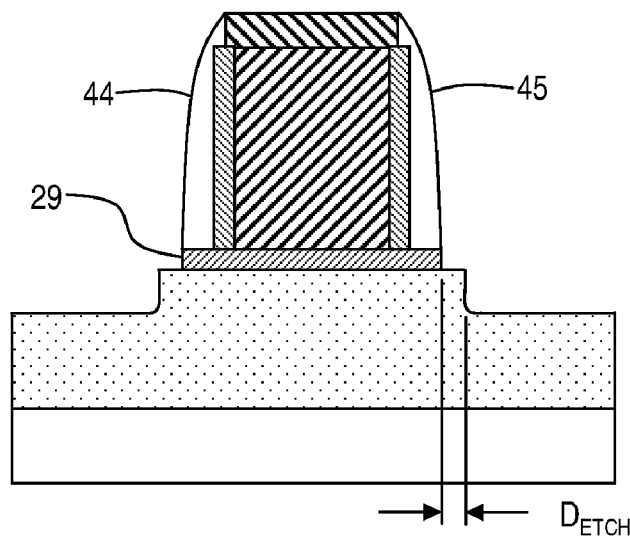
FIGS. 3A-3C are cross-sectional views depicting the semiconductor device of FIGS. 1A-1D during various phases in preparation for and during formation of an embedded material according to a second process mechanism.
Figure 3B:
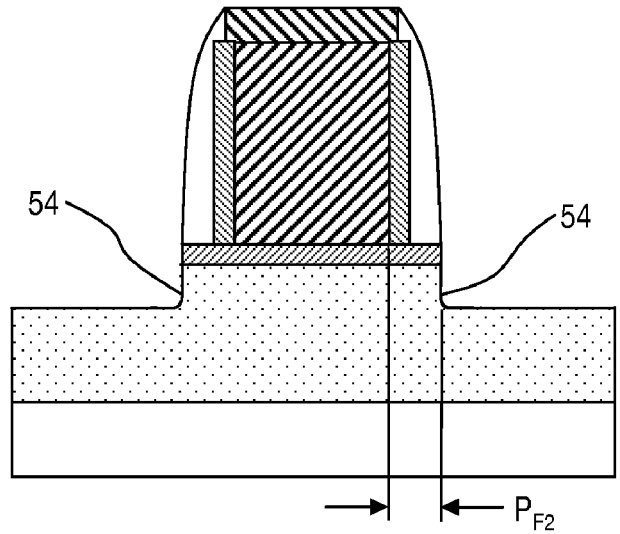
Figure 3C:
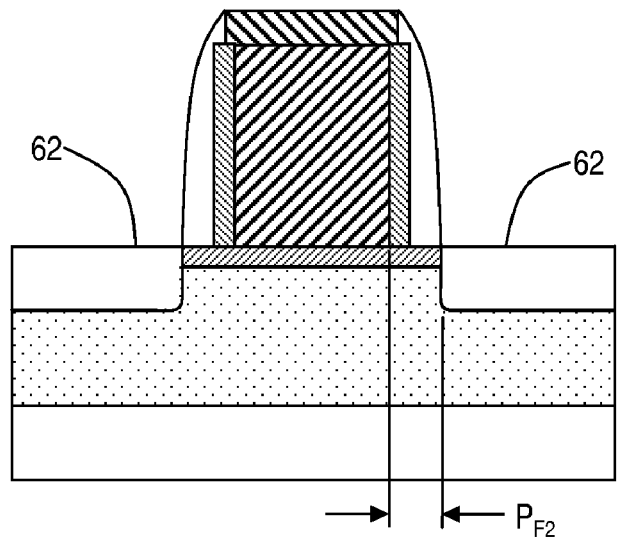

FIGS. 2A-2C are cross-sectional views depicting the semiconductor device during various phases in preparation for and during formation of the embedded material according to a first process mechanism, and FIGS. 3A-3C are cross-sectional views depicting the semiconductor device during various phases in preparation for and during formation of the embedded material according to a second process mechanism. Step 409 in FIG. 4 relates to the depictions in FIGS. 2A and 3A, step 411 relates to the depictions in FIGS. 2B and 3B, and step 413 relates to the depictions in FIGS. 2C and 3C, and these steps will be discussed below.

Embedded materials, particularly for strain engineering, have become an integral part of semiconductor devices, and the inventors have determined that additional control mechanisms are required to provide a manufacturable solution. The proximity of the embedded materials next to the gate can greatly affect device performance and process yield. With in-line measurement of proximity, development control knobs for proximity tuning can be difficult. Thus, embodiments of the present invention advantageously provide a simple advanced process control (APC) scheme with active feed-forward and feed-back in order to make these processes feasible for manufacture.

Embodiments of the invention, for example, propose the use of controlled pre-clean and pre-bake steps before the growth/deposition of embedded material to actively control proximity. Before a film for the formation of the embedded material is grown or deposited in the recess, in order to ensure a high-quality film, a pre-clean step is performed to remove the surface oxide, and then a pre-bake step is performed that expels contaminants. The pre-clean step will also etch and undercut the oxide liner under the nitride spacers according to the first process mechanism as shown in FIG. 2A, and/or etch the nitride spacers according to the second process mechanism as shown in FIG. 3A. By selecting the right chemistry and conditions, the amount of undercut in the first process mechanism can be controlled, and the amount of spacers etched in the second process mechanism can be controlled. The pre-bake step then reflows the oxide, thereby aligning the innermost edge of the recess to the new edge of the oxide underlayer or spacer, thereby bringing the innermost edges of the recess closer to the gate.

Thus, FIG. 2A depicts the result of an epitaxy pre-clean step to remove surface oxide, in which the oxide layer 27 (shown in FIG. 1D) is etched and undercut under the nitride spacers and result in oxide layer 28 according to the first process mechanism. The oxide layer is etched and undercut by a distance $D_{UNDERCUT}$. By selecting the right chemistry and conditions, the amount of undercut in the first process mechanism can be controlled, as will be discussed further below. Following the pre-clean step, an epitaxy pre-bake step will then be performed to expel contaminates. The pre-bake step reflows the silicon, thereby reshaping the recess to form a recess 52 having an innermost edge thereof that is aligned with the new edge of the oxide layer 28 as shown in FIG. 2B, and thereby causing a proximity change by bringing the innermost edges of the recess closer to the gate. Accordingly, the innermost edges of the recess 52, at this stage, have a final proximity ($P_{F1}$) to the gate 30 in accordance with the first process mechanism, as shown in FIGS. 2B and 2C. Thus, when the embedded material 60 (e.g., eSiGe or eSiC) is grown or deposited within recess 52, then the proximity of the embedded material to the gate is the final proximity ($P_{F1}$) value.

Alternatively or in addition to the proximity change caused due to the first process mechanism, the second process mechanism can also cause a proximity change, as discussed with respect to FIGS. 3A-3C. FIG. 3A depicts the result of an epitaxy pre-clean step to remove surface oxide, in which the nitride spacers 42 and 43 (shown in FIGS. 1C and 1D) are etched and result in nitride spacers 44 and 45, and in which the oxide layer 27 (shown in FIG. 1D) is also etched to aligned with the nitride spacers 44 and 45 and result in oxide layer 29. The nitride spacers and oxide layer are etched by a distance DETCH. By selecting the right chemistry and conditions, the amount of etching in the second process mechanism can be controlled, as will be discussed further below. Following the pre-clean step, an epitaxy pre-bake step will then be performed to expel contaminates. The pre-bake step reflows the oxide, thereby reshaping the recess to form a recess 54 having an innermost edge thereof that is aligned with the new edge of the oxide layer 29 as shown in FIG. 3B, and thereby causing a proximity change by bringing the innermost edges of the recess closer to the gate. Accordingly, the innermost edges of the recess 54, at this stage, have a final proximity ($P_{F2}$) to the gate 30 in accordance with the second process mechanism, as shown in FIGS. 3B and 3C. Thus, when the embedded material 62 (e.g., eSiGe or eSiC) is grown or deposited within recess 54, then the proximity of the embedded material to the gate is the final proximity ($P_{F2}$) value.

Figure 5:
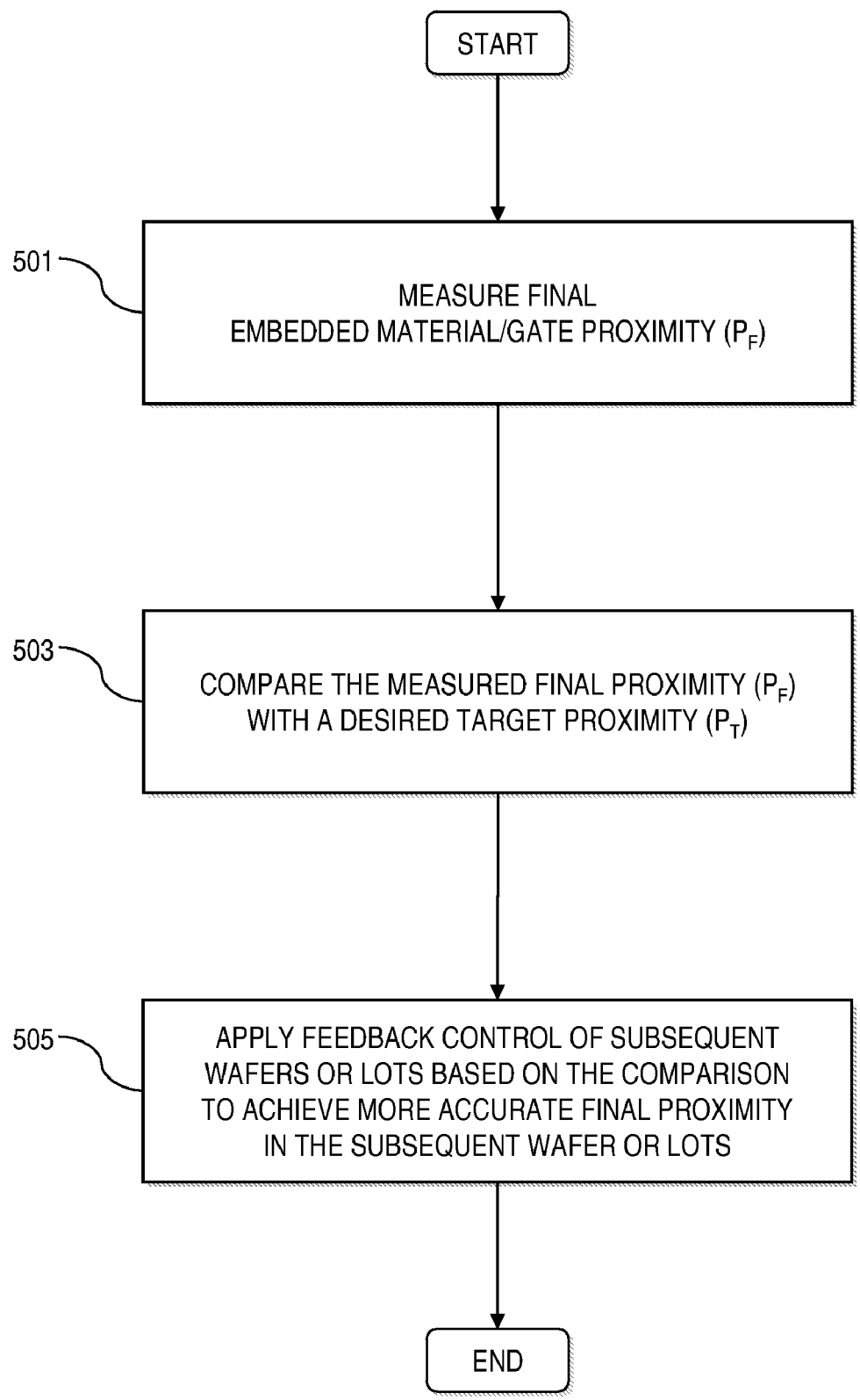
FIG. 5 is a flow-diagram of a process of applying feedback control, according to an embodiment of the invention.

FIG. 5 is a flow-diagram of a process of applying feedback control according to an embodiment of the present invention. In step 501, a final proximity ($P_F$) value of a device (e.g., made using the process in FIG. 4, and which can include $P_{F1}$, $P_{F2}$, or a combination thereof) is measured using, for example, scatterometry metrology. Such a measurement can either be made prior to growth or deposition of the embedded material (e.g., at the stages shown in FIGS. 2B and 3B), or after the formation of the embedded material (e.g., at the stages shown in FIGS. 2C and 3C). In step 503, the measured final proximity ($P_F$) value will be compared to a target proximity ($P_T$) value. The target proximity ($P_T$) value is the desired proximity value that is predetermined to achieve optimal effectiveness of the embedded material. In step 505, the comparison between the measured final proximity ($P_F$) value and the target proximity ($P_T$) value will be used to apply feedback control to vary the processes used to manufacture the device in subsequent wafers or subsequent lots in order to achieve a more accurate final proximity ($P_F$) value in the subsequent wafers or subsequent lots that more closely conforms to the target proximity ($P_T$) value.

Figure 6:
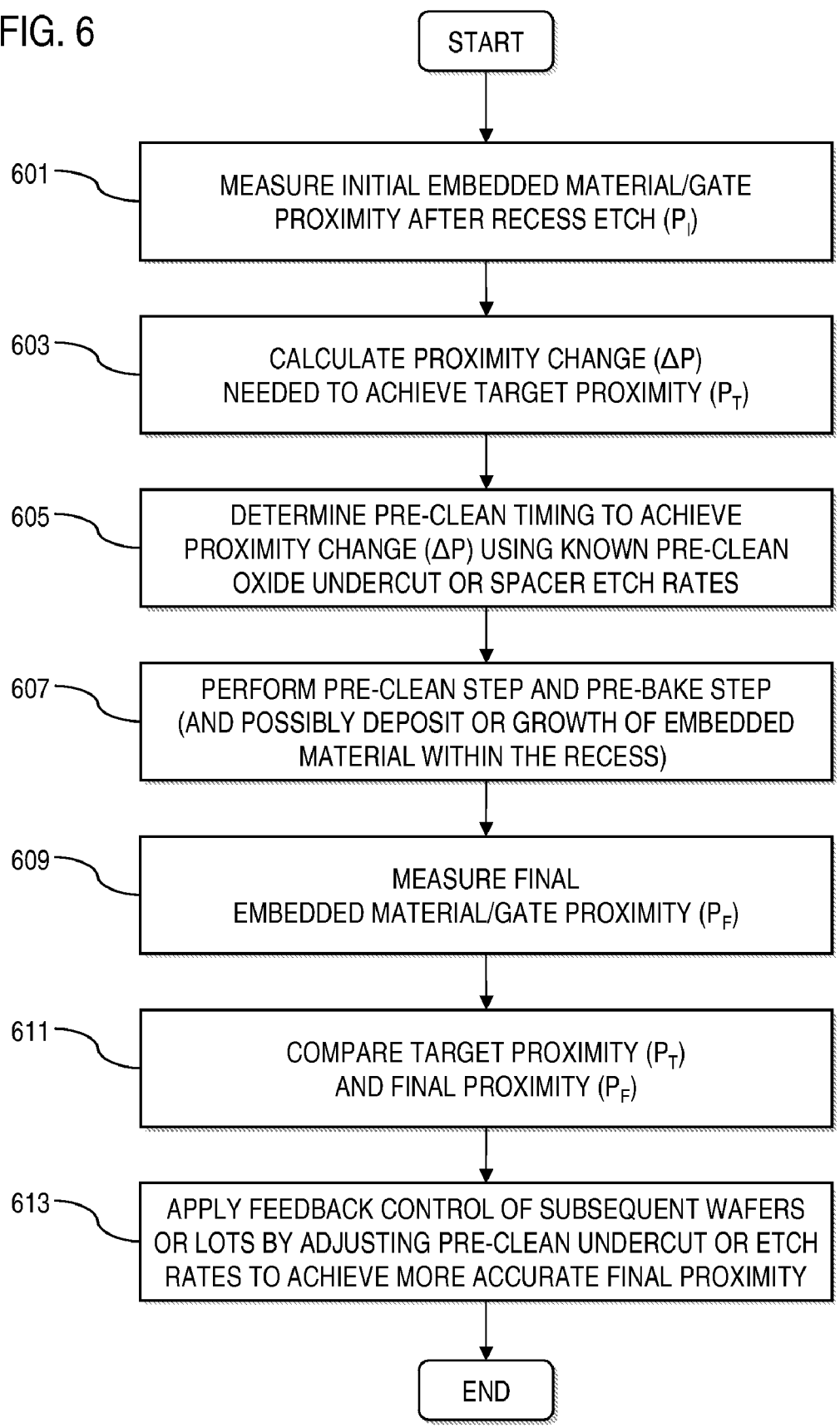
FIG. 6 is a flow-diagram of an embodiment of a process including pre-cleaning and pre-baking of an embedded material recess, and applying feedback control to subsequent wafers and/or lots, according to an embodiment of the invention.
Figure 7:
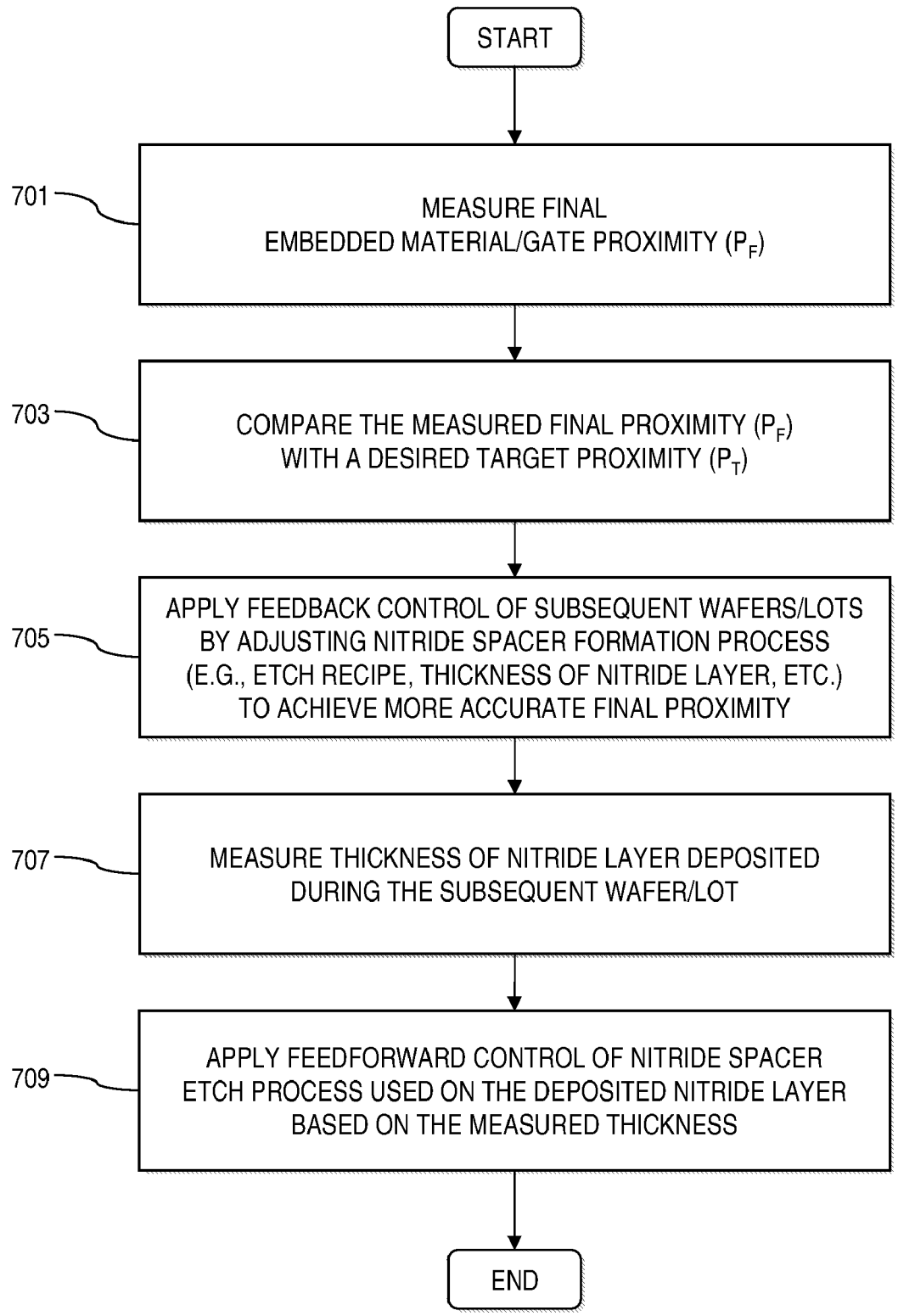
FIG. 7 is a flow-diagram of a process including an embodiment of a process of applying feedback control by adjusting a spacer formation process, in conjunction with a process of applying feedforward control by adjusting a nitride spacer etch process.
Figure 8:
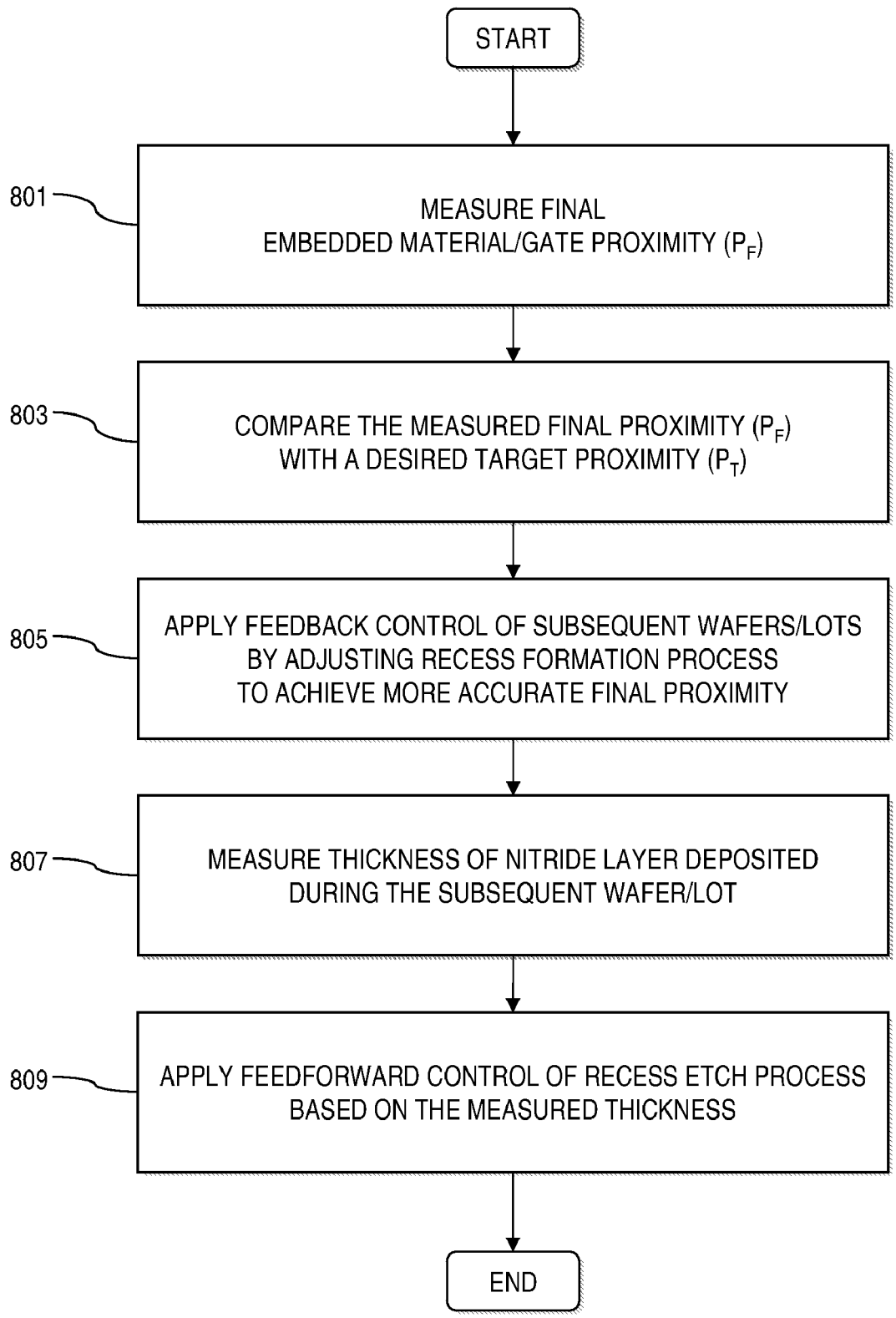
FIG. 8 is a flow-diagram of a process including an embodiment of a process of applying feedback control by adjusting an embedded material recess formation process, in conjunction with a process of applying feedforward control by adjusting an embedded material recess etch process.

FIGS. 6-8 set forth several exemplary embodiments of processes that can be used singularly or in combination to perform such feedback control, and also set forth processes that can be used to perform feedforward (or in-line) control to achieve a more accurate final proximity ($P_F$) value that more closely conforms to the target proximity ($P_T$) value. Ideally, such processes can be used to achieve a final proximity ($P_F$) value that is equal to the target proximity ($P_T$) value.

FIG. 6 is a flow-diagram of an embodiment of a process that begins following step 407 in FIG. 4 and can be used to supplement the remaining steps therein to apply feedforward control based on measured values and feedback control to subsequent wafers and/or lots. In step 601, after etching of the recess (e.g., recess 50 in FIG. 1D), an initial proximity ($P_I$) value of the recess to the gate (e.g., gate 30) is measured (e.g., using scatterometry metrology). In step 603, a proximity change ($\Delta P$) value needed to achieve a desired target proximity ($P_T$) value can be calculated by calculating the difference between the measured initial proximity ($P_I$) value and the predetermined target proximity ($P_T$) value. This proximity change ($\Delta P$) value will equal or substantially equal the distance $D_{UNDERCUT}$ in FIG. 2A and the distance $D_{ETCH}$ in FIG. 3A, either singularly or in combination depending upon whether one or both of the process mechanisms occurs during the pre-clean step. Theoretical and/or historical data can be used to determine known (i.e., predetermined) rates of oxide undercut and etch (as seen in FIG. 2A) and/or rates of spacer etch (as seen in FIG. 3A) in terms of various elements of the pre-clean recipe, characteristics of the particular machine being used to perform the pre-clean procedure, etc. Thus, based on these known rates, and based on the proximity change ($\Delta P$) value needed to achieve the target proximity ($P_T$) value, the pre-clean timing can be determined in step 605. Note that step 605 can be more generally characterized as determining any element of the pre-clean recipe in order to achieve the proximity change ($\Delta P$) value needed to achieve the target proximity ($P_T$) value using known effects of varying elements of the pre-clean recipe on the oxide undercut and etch (as seen in FIG. 2A) and/or spacer etch (as seen in FIG. 3A). Following the determination made in step 605, then the process proceeds to step 607, which includes performing the pre-clean step and then the pre-bake step. In addition, step 607 can also include the step of forming the embedded material within the recess prior to continuing to step 609, or, alternatively, the formation of the embedded material in the recess can occur at some point after step 609.

The process of FIG. 6 proceeds to perform an embodiment of a process of applying feedback control, in a manner similar to that discussed above with respect to FIG. 5. In step 609, a final proximity ($P_F$) value of the recess (e.g., recess 52 in FIGS. 2B and 2C, or recess 54 in FIGS. 3B and 3C) to the gate (e.g., gate 30) is measured (e.g., using scatterometry metrology). In step 611, the measured final proximity ($P_F$) value is compared to the target proximity ($P_T$) value. In step 613, the comparison between the measured final proximity ($P_F$) value and the target proximity ($P_T$) value will be used to apply feedback control to vary the pre-clean process (e.g., the pre-clean recipe, such as the pre-clean undercut or etch rates, pre-clean timing, etc.) used to manufacture the device in subsequent wafers or subsequent lots in order to achieve a more accurate final proximity ($P_F$) value in the subsequent wafers or subsequent lots that more closely conforms to the target proximity ($P_T$) value.

FIG. 7 is a flow-diagram of another embodiment of a process of applying feedback control, in conjunction with a process of applying feedforward control. In step 701, a final proximity ($P_F$) value of a device (e.g., made using the process in FIG. 4, and which can include $P_{F1}$, $P_{F2}$, or a combination thereof) is measured using, for example, scatterometry metrology. Such a measurement can either be made prior to growth or deposition of the embedded material (e.g., at the stages shown in FIGS. 2B and 3B), or after the formation of the embedded material (e.g., at the stages shown in FIGS. 2C and 3C). In step 703, the measured final proximity ($P_F$) value will be compared to a target proximity ($P_T$) value. In step 705, the comparison between the measured final proximity ($P_F$) value and the target proximity ($P_T$) value will be used to apply feedback control to vary the processes used to manufacture the device in subsequent wafers or subsequent lots in order to achieve a more accurate final proximity ($P_F$) value in the subsequent wafers or subsequent lots that more closely conforms to the target proximity ($P_T$) value. In this embodiment, the feedback control is used to adjust the process of forming the nitride spacers.

A first manner in which the process of forming the nitride spacers can be controlled using the feedback control includes controlled variation of the nitride spacer etch trim process. Thus, a technique is provided for APC of embedded material/gate proximity using scatterometry based metrology by utilizing controlled variation of the nitride spacer etch trim process. Such a technique can include adding an isotropic spacer trim step prior to or after the usual spacer etch process (e.g., the etch process discussed with respect to step 405 in FIG. 4, and FIG. 1C), so that the initial gate proximity ($P_I$) value can be modulated by varying the etch duration and thus the width of the nitride spacers 42 and 43, which will correspondingly effect the final gate proximity ($P_F$) value. For example, by adding such a trim step, the nitride spacers will be narrower than without such a trim step, which will result in a smaller initial gate proximity ($P_I$) value, which (assuming the same pre-clean process is used thereon and thus the same values of $D_{UNDERCUT}$ and $D_{ETCH}$) will result in a smaller final gate proximity ($P_F$) value. Alternatively, rather than adding a spacer trim step, the usual spacer etch process can be modified to achieve the desired width of the nitride spacers needed to achieve final gate proximity ($P_F$) value that is closer to the desired target gate proximity ($P_T$). With this APC technique, the spacer formation process (e.g., etch trim recipe, etc.) can be modified to target a specific proximity value, and can account for and make corrections for various wafer and/or lot level trends using feedback control.

A second manner in which the process of forming the nitride spacers can be controlled using the feedback control includes controlled variation of the nitride spacer deposition process. Thus, a technique is provided for APC of embedded material/gate proximity using scatterometry based metrology by utilizing controlled variation of the nitride spacer deposition process. Such a technique can include modifying the nitride deposition process (e.g., the deposition process discussed with respect to step 403 in FIG. 4, and FIG. 1B) to vary the thickness (T) of the nitride layer, to target a specific final proximity value, and account for and make corrections for various wafer and/or lot level trends using feedback control. This APC technique can also account for deposition chamber differences by shifting target nitride layer thickness along with utilizing, dispatching, and scheduling elements. For instance, if a given etcher (referred to herein as "Etcher Number One") is known through feedback to produce a low value for final gate proximity due to a higher lateral etch rate (i.e., as compared to other etchers using the same processes on the same devices), then a nitride layer having a greater thickness (T) can be intentionally deposited during step 403. This lot would then be "tagged" after step 403 as being assigned to Etcher Number One, such that when the lot reached step 405 or step 407, then a dispatching system would know to assign that lot to Etcher Number One for performing step 405 and/or step 407.

In addition to the application of feedback control, the embodiment in FIG. 7 also performs a process of applying feedforward control. Thus, after adjusting the nitride spacer formation process, a nitride layer (e.g., nitride layer 40 in FIG. 1B) is deposited using the adjusted process. Then, in step 707, an actual thickness (T) of the deposited nitride layer is measured using, for example, scatterometry metrology. Then, in step 709, any errors or deviations in the measured thickness as compared to the intended thickness will be accounted for by applying feedforward control. Thus, for example, the feed-forward control can be used to account for and correct thickness errors with modification in the spacer etch process (e.g., in step 405), for example, by modifying the spacer etch trim recipe, or possibly adding a spacer etch trim process to the usual spacer etch process, in order to achieve the desired results of the spacer etch process and corresponding desired proximity value.

FIG. 8 is a flow-diagram of a further embodiment of a process of applying feedback control, in conjunction with a process of applying feedforward control. In step 801, a final proximity ($P_F$) value of a device (e.g., made using the process in FIG. 4, and which can include $P_{F1}$, $P_{F2}$, or a combination thereof) is measured using, for example, scatterometry metrology. Such a measurement can either be made prior to growth or deposition of the embedded material (e.g., at the stages shown in FIGS. 2B and 3B), or after the formation of the embedded material (e.g., at the stages shown in FIGS. 2C and 3C). In step 803, the measured final proximity ($P_F$) value will be compared to a target proximity ($P_T$) value. In step 805, the comparison between the measured final proximity ($P_F$) value and the target proximity ($P_T$) value will be used to apply feedback control to vary the processes used to manufacture the device in subsequent wafers or subsequent lots in order to achieve a more accurate final proximity ($P_F$) value in the subsequent wafers or subsequent lots that more closely conforms to the target proximity ($P_T$) value. In this embodiment, the feedback control is used to adjust the process of forming the recess for the embedded material.

Thus, a technique for APC of embedded material/gate proximity using scatterometry based metrology by utilizing controlled variation of the recess etch process. Such a technique can include modifying the recess etch process (e.g., the etch process discussed with respect to step 407 in FIG. 4, and FIG. 1D to control undercutting of the recess beneath the oxide layer, and/or the pre-clean steps discussed with respect to FIGS. 2A and/or 3A, and/or the process discussed with respect to steps 603, 605, and 607 in FIG. 6) to vary the recess etch recipe to target a specific final proximity value, and account for and make corrections for various wafer and/or lot level trends using feedback control. In addition to the application of such feedback control, the embodiment in FIG. 8 also performs a process of applying feedforward control. Thus, in step 807, an actual thickness (T) of the deposited nitride layer in the subsequent wafer/lot is measured using, for example, scatterometry metrology. Then, in step 809, any errors or deviations in the measured thickness as compared to the intended thickness will be accounted for by applying feedforward control of the recess etch process. Thus, for example, the feed-forward control can be used to account for and correct thickness errors with modification in the recess etch process (e.g., in step 405, and/or the pre-clean steps discussed with respect to FIGS. 2A and/or 3A, and/or the process discussed with respect to steps 603, 605, and 607), in order to achieve the desired proximity value. For example, the recipe(s) for the etch and/or pre-clean step can be modified, or an isotropic etch step can be added to etch the recess so that the gate proximity can be modulated by varying etch duration.

The various embodiments allows for active control of embedded material/gate proximity, which advantageously provides for manufacturable embedded material based technology. The use of scatterometry metrology techniques in exemplary embodiments advantageously provide high-quality, in-line, non-destructive techniques to measure parameters of the embedded material structure, specifically gate proximity.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A method comprising:
forming an oxide layer, having a width, on a substrate
forming a gate of a semiconductor device on the oxide layer; and
forming a recess for an embedded silicon-straining material in source and drain regions for the gate; and
changing the width of the oxide layer to control a proximity value, which is defined as a distance between the gate and a closest edge of the recess.

2. A method comprising:
forming a gate of a semiconductor device on a substrate; and
forming a recess for an embedded silicon-straining material in source and drain regions for the gate,
wherein a proximity value, which is defined as a distance between the gate and a closest edge of the recess, is controlled by controlling formation of an oxide layer provided beneath the gate, and
wherein the forming of the recess includes:
etching the substrate to form the recess having an initial proximity value that is based on a first configuration of the oxide layer;
pre-cleaning the recess, wherein the oxide layer changes to a second configuration; and
pre-baking the recess to form the recess having a final proximity value that is based on the second configuration of the oxide layer,
wherein the pre-cleaning is controlled to form the recess with the final proximity value that approximates a target proximity value.

3. The method according to claim 2, wherein the forming of the recess further includes:
measuring the initial proximity value;
calculating a proximity value change needed to change the initial proximity value to a target proximity value; and
determining timing of the pre-cleaning of the recess needed change the oxide layer to the second configuration to achieve the target proximity value, wherein the timing is determined based upon predetermined rates of change of the oxide layer during pre-cleaning.

4. The method according to claim 3, wherein the change in the oxide layer to the second configuration is caused by undercutting of the oxide layer during the pre-cleaning of the recess, and wherein the timing is determined based upon predetermined undercutting rates of the oxide layer during pre-cleaning.

5. The method according to claim 3, wherein the change in the oxide layer to the second configuration is caused by etching of nitride spacers on sides of the gate and etching of portions of the oxide layer exposed due to etching of the nitride spacers during the pre-cleaning of the recess, and wherein the timing is determined based upon predetermined etching rates of the oxide layer during pre-cleaning.

6. The method according to claim 3, further comprising:
measuring the final proximity value;
comparing the measured final proximity value to the target proximity value; and
applying feedback control to adjust a subsequent pre-cleaning process performed on a subsequent semiconductor device by adjusting the determined timing of the pre-cleaning in the subsequent pre-cleaning process based on the comparison between the measured final proximity value and the target proximity value to decrease a difference between a final proximity value of the subsequent semiconductor device and the target proximity value.

7. The method according to claim 1, further comprising:
measuring the proximity value;
comparing the measured proximity value to a target proximity value; and
applying feedback control to adjust a subsequent oxide layer formation process performed on a subsequent semiconductor device based on the comparison between the measured proximity value and the target proximity value to decrease a difference between a proximity value of the subsequent semiconductor device and the target proximity value.

8. A method comprising:
forming a gate of a semiconductor device on a substrate; and
forming a recess for an embedded silicon-straining material in source and drain regions for the gate,
wherein a proximity value, which is defined as a distance between the gate and a closest edge of the recess, is controlled by controlling formation of an oxide layer provided beneath the gate, and the method further comprising:

measuring the proximity value;

comparing the measured proximity value to a target proximity value; and applying feedback control to adjust a subsequent oxide layer formation process performed on a subsequent semiconductor device based on the comparison between the measured proximity value and the target proximity value to decrease a difference between a proximity value of the subsequent semiconductor device and the target proximity value, wherein the feedback control adjusts the subsequent oxide layer formation process by adjusting a nitride spacer formation process used to form nitride spacers on sides of the gate, and wherein the oxide layer is formed by an etching process and/or a pre-cleaning process that etch portions of the oxide layer that are not covered by the nitride spacers or the gate.

9. The method according to claim 8, wherein the feedback control adjusts the nitride spacer formation process by:

adjusting an etch recipe used to etch a nitride layer to form the nitride spacers; or adjusting a thickness of a nitride layer deposited on the gate, and wherein the nitride layer is etched to form the nitride spacers.

10. A method comprising:

forming a gate of a semiconductor device on a substrate; and forming a recess for an embedded silicon-straining material in source and drain regions for the gate, wherein a proximity value, which is defined as a distance between the gate and a closest edge of the recess, is controlled by controlling formation of an oxide layer provided beneath the gate, and the method further comprising:

measuring the proximity value;

comparing the measured proximity value to a target proximity value; and applying feedback control to adjust a subsequent oxide layer formation process performed on a subsequent semiconductor device based on the comparison between the measured proximity value and the target proximity value to decrease a difference between a proximity value of the subsequent semiconductor device and the target proximity value, wherein the forming of the recess includes:

depositing a nitride layer on the gate;

measuring a thickness of the nitride layer deposited on the gate;

etching the nitride layer to form nitride spacers on sides of the gate;

etching portions of the oxide layer that are not covered by the nitride spacers or the gate; and etching exposed portions of the substrate that are exposed beneath the oxide layer, and wherein the method further comprises applying feedforward control to adjust the etching of the nitride spacers or the etching of the exposed portions based on the measured thickness.

11. The method according to claim 1, further comprising:

measuring the proximity value;

comparing the measured proximity value to a target proximity value; and applying feedback control to adjust a subsequent recess formation process performed on a subsequent semiconductor device based on the comparison between the measured proximity value and the target proximity value to decrease a difference between a proximity value of the subsequent semiconductor device and the target proximity value.

12. The method according to claim 1, wherein the proximity value is controlled by controlling formation of the oxide layer based upon wafer level trends, lot level trends, and/or trends associated with a particular machine used during formation of the oxide layer.

13. A method comprising:

forming a gate of a semiconductor device on a substrate;

forming a recess for an embedded silicon-straining material in source and drain regions for the gate;

measuring a proximity value of the recess, wherein the proximity value is defined as a distance between the gate and a closest edge of the recess;

comparing the measured proximity value to a target proximity value; and adjusting a subsequent recess formation process performed on a subsequent semiconductor device by applying feedback control based on the comparison between the measured proximity value and the target proximity value to decrease a difference between a proximity value of the subsequent semiconductor device and the target proximity value.

14. The method according to claim 13, wherein the forming of the recess includes:

etching the substrate to form the recess having an initial proximity value that is based on a first configuration of an oxide layer beneath the gate;

pre-cleaning the recess, wherein the oxide layer changes to a second configuration; and pre-baking the recess to form the recess having a final proximity value that is based on the second configuration of the oxide layer, wherein the pre-cleaning is controlled to form the recess with the final proximity value that approximates the target proximity value.

15. The method according to claim 14, wherein the feedback control includes adjusting a timing of the pre-cleaning in a subsequent pre-cleaning process of the subsequent semiconductor device based on the comparison between the measured final proximity value and the target proximity value.

16. The method according to claim 13, wherein the feedback control adjusts a nitride spacer formation process used to form nitride spacers on sides of the gate, wherein an oxide layer beneath the gate is formed by an etching process and/or a pre-cleaning process that etch portions of the oxide layer that are not covered by the nitride spacers or the gate, and wherein the recess is formed by etching portions of the substrate exposed beneath the oxide layer.

17. The method according to claim 13, wherein the forming of the recess includes:

depositing a nitride layer on the gate;

measuring a thickness of the nitride layer deposited on the gate;

etching the nitride layer to form nitride spacers on sides of the gate;

etching portions of the oxide layer that are not covered by the nitride spacers or the gate; and etching exposed portions of the substrate that are exposed beneath the oxide layer, and wherein the method further comprises applying feedforward control to adjust the etching of the nitride spacers or the etching of the exposed portions based on the measured thickness.

18. The method according to claim 13, wherein the feedback control adjusts the recess formation process by adjusting an etch recipe used to etch the recess.

19. The method according to claim 13, wherein the feed back control adjusts the recess formation process based upon wafer level trends, lot level trends, and/or trends associated with a particular machine used during formation of the recess.

20. A method comprising:
forming a gate of a semiconductor device on a substrate;
forming a recess for an embedded silicon-straining material in source and drain regions for the gate; and
controlling a distance between the gate and a closest edge of the recess by controlling process steps in the formation of the recess using feed forward control based upon values measured during the formation of the recess.

21. The method according to claim 1, comprising:
changing the width of the oxide layer from a first width to a second width; and
adjusting the recess based on the second width.

22. The method according to claim 1, comprising etching the oxide layer to reduce the first width to the second width.

* * * * *